United States Patent [19]
Fuke et al.

[11] Patent Number: 5,725,728
[45] Date of Patent: Mar. 10, 1998

[54] PELLET PICK-UP DEVICE

[75] Inventors: Shigeru Fuke, Musashino; Tsuneharu Arai, Fussa; Osamu Nakamura, Kokubunji, all of Japan

[73] Assignee: Kabushiki Kaisha Shinkawa, Tokyo, Japan

[21] Appl. No.: 715,189

[22] Filed: Sep. 17, 1996

[30] Foreign Application Priority Data

Sep. 18, 1995 [JP] Japan ................... 7-263490

[51] Int. Cl.⁶ ..................................... B32B 35/00
[52] U.S. Cl. .............. 156/584; 156/344; 437/226; D29/426.6
[58] Field of Search ................... 156/344, 584; 437/226; 29/426.3, 426.4, 426.5, 426.6

[56] References Cited

U.S. PATENT DOCUMENTS 5,332,406   7/1994   Takeuchi et al. ............. 437/226 X

FOREIGN PATENT DOCUMENTS

| | | | |
|---|---|---|---|
| 59-232435 | 12/1984 | Japan | 437/226 |
| 61-187247 | 8/1986 | Japan | 437/226 |
| 62-106642 | 5/1987 | Japan | H01L 21/68 |
| 1-44018 | 9/1989 | Japan | H01L 21/78 |
| 4-282853 | 10/1992 | Japan | 437/226 |
| 5-41451 | 2/1993 | Japan | 437/226 |
| 6-9219 | 2/1994 | Japan | H01L 21/78 |

*Primary Examiner*—Mark A. Osele
*Attorney, Agent, or Firm*—Koda and Androlia

[57] ABSTRACT

A pellet pick-up device including a wafer sheet stretching structure that includes a vertical driving assembly which raises and lowers the wafer sheet stretching ring and includes synchronously driven first and second motors which raise and lower portions of the wafer sheet stretching ring that are symmetrical with respect to the center of the wafer sheet supporting ring.

4 Claims, 4 Drawing Sheets

PELLET PICK-UP DEVICE

BACKGROUND OF THE INVENTION

1. Field of the Invention

The present invention relates to a pellet pick-up device equipped with a wafer sheet stretching mechanism which stretches wafer sheets to which pellets are pasted.

2. Prior Art

Examples of conventional pellet pick-up devices equipped with a wafer sheet stretching mechanism are described in Japanese Patent Application Publication (Kokoku) Nos. 1-44018 and 6-9219 and Japanese Patent Application Laid-Open (Kokai) No. 62-106642.

These devices are equipped with a wafer sheet supporting ring which supports a wafer sheet to which pellets are pasted, a wafer sheet stretching ring which is installed above the wafer sheet supporting ring so as to fit loosely on the wafer sheet supporting ring and act in conjunction with the wafer sheet supporting ring to stretch the wafer sheet, and two air cylinders which raise and lower the wafer sheet stretching ring.

In the prior art described above, the wafer sheet stretching ring is driven upward and downward by air cylinders. Accordingly, the amount by which the wafer sheet stretching ring is lowered is determined by the stroke that brings the wafer sheet stretching ring into contact with the wafer sheet supporting ring. As a result, the amount of optimal stretching of the wafer sheet to which pellets are pasted is not obtainable. Furthermore, when the operating strokes of the two air cylinder is changed, the amount of stretching of the wafer sheet becomes inconsistent, but it is not possible to detect this inconsistency.

SUMMARY OF THE INVENTION

Accordingly, the main object of the present invention is to provide a pellet pick-up device equipped with a wafer sheet stretching mechanism which allows arbitrary control of the amount of stretching of the wafer sheet.

It is the secondary object of the present invention to provide a pellet pick-up device equipped with a wafer sheet stretching mechanism which makes it possible to detect any change occurring in the amount of stretching of the wafer sheet.

The above objects of the present invention are accomplished by a unique structure for a pellet pick-up device equipped with a wafer sheet stretching mechanism comprising a wafer sheet supporting ring on which a wafer sheet to which pellets are pasted is placed, a wafer sheet stretching ring which is provided above the wafer sheet supporting ring, and a vertical driving means which raises and lowers the wafer sheet stretching ring, so that the vertical driving mechanism lowers the wafer sheet stretching ring in order to stretch the wafer sheet; and the unique structure of the present invention is that the vertical driving means consists of synchronously driven first and second motors which are provided symmetrically with respect to the center of the wafer sheet supporting ring so as to raise and lower the wafer sheet stretching ring.

In addition, according to the present invention, the synchronous rotation or lack of synchronous rotation of the first and second motors is detected; and in cases where the motors are not rotating in synchronism, an out-of-synchronization error signal is outputted so as to discontinue the stretching of the wafer sheet.

DETAILED DESCRIPTION OF THE PREFERRED EMBODIMENTS

A preferred embodiment of the present invention will be described with reference to FIGS. 1 through 5.

Figure 1:
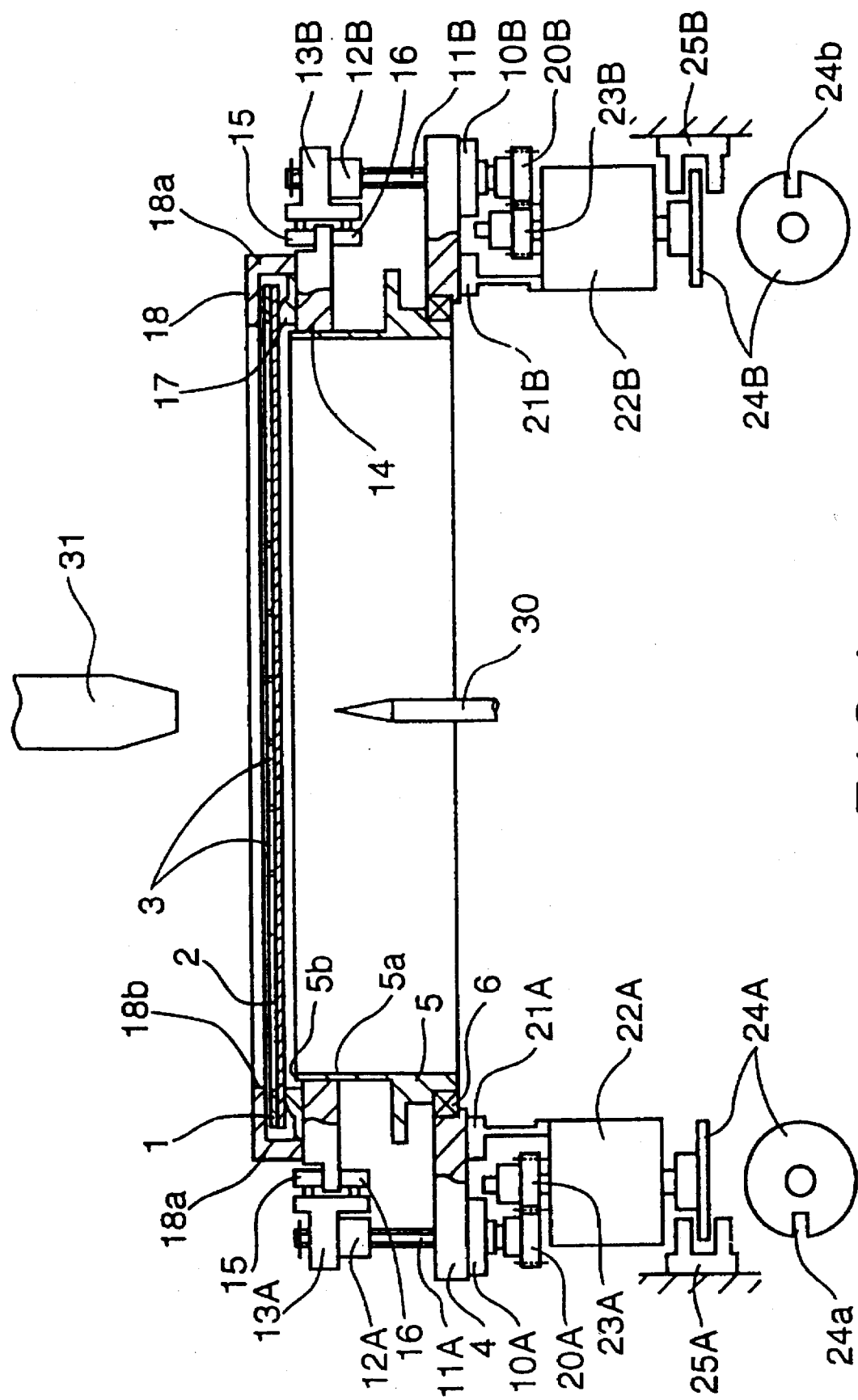
FIG. 1 is a partially cross sectional view of a preferred embodiment of the pellet pick-up device equipped with the wafer sheet stretching mechanism according to the present invention.
Figure 2:
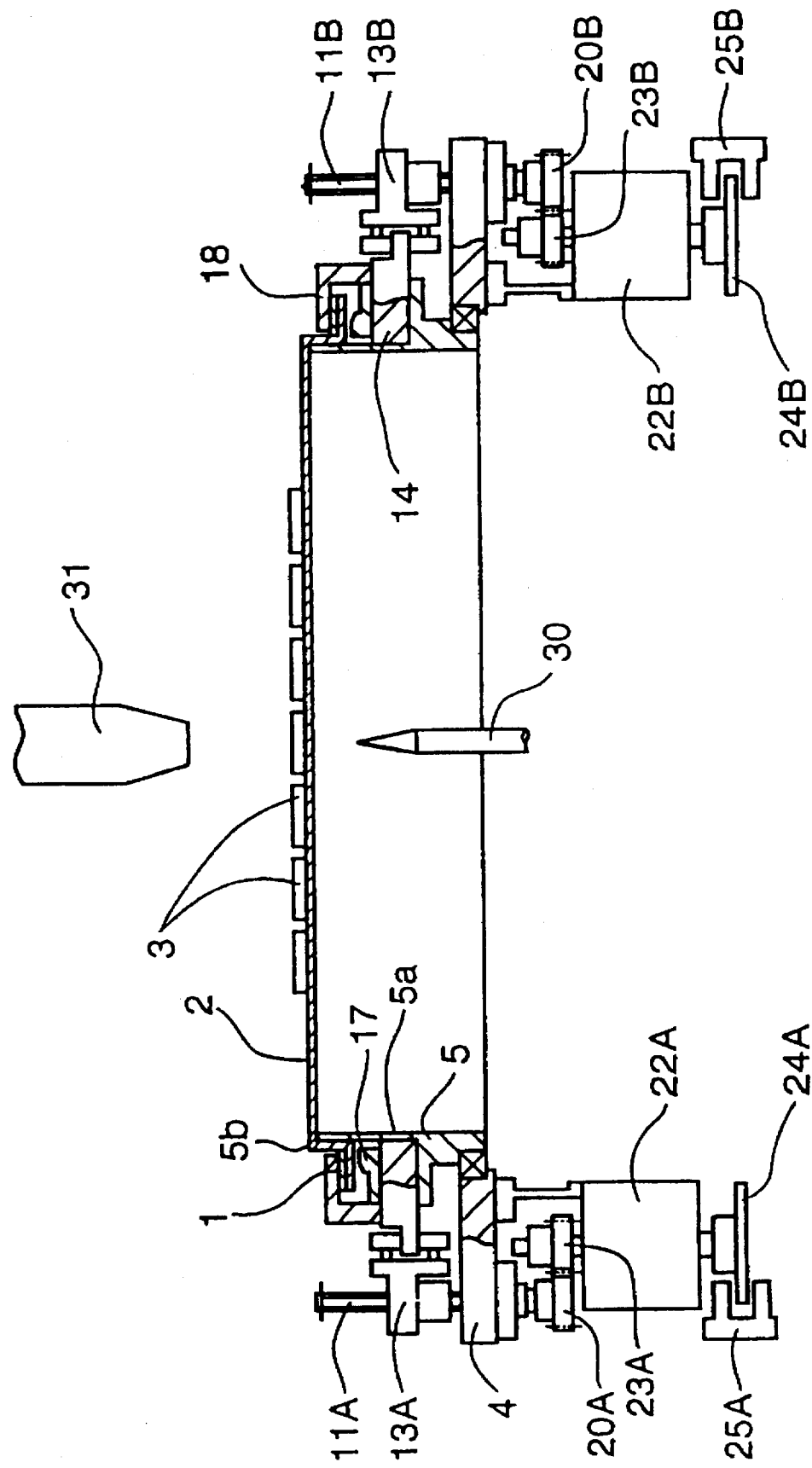
FIG. 2 is a partially cross sectional view of the wafer sheet stretching ring holder which is employed in the stretching mechanism and positioned at a lowered end.

In essence, according to one of the preferred embodiments of the present invention, as shown in FIGS. 1 and 2, a wafer sheet supporting ring 5 on which a wafer sheet 2 is placed, a wafer sheet stretching ring 18 installed above the wafer sheet supporting ring 5, and first and second motors 22A and 22B which move the wafer sheet stretching ring 18 up and down are utilized; and the first and second motors 22A and 22B are arranged at symmetrical locations with respect to the center of the wafer sheet supporting ring 5. Thus, the wafer sheet stretching ring 18 is lowered by the first and second motors 22A and 22B so that the wafer sheet 2 is stretched evenly for a predetermined extent.

In addition, the synchronous rotation (or lack of synchronous rotation) of the first and second motors 22A and 22B is detected by first and second sensors 25A and 25B for each rotation thereof; and in cases where the motors are not rotating in synchronism, an out-of-synchronization error signal is outputted to an error display device 39 by an operation controller 37.

The detection of the synchronous rotation of the first and second motors 22A and 22B could be performed at intervals of less than one rotation, or at intervals of more than one rotation, and thus is not limited to intervals of one rotation.

A further detailed description is provided below.

As best seen from FIG. 1, a wafer sheet 2 includes a plurality of pellets 3 which have been cut and pasted to one surface of the wafer sheet 2. The wafer sheet 2 is adhesively fastened to a wafer ring 1 at its outer circumferential portion.

A supporting plate 4 is fastened to an XY table (not shown) which is driven in the X and Y (or horizontal) directions, and a wafer sheet supporting ring 5 is provided on the supporting plate 4 with bearings 6 in between so that the wafer sheet supporting ring 5 is rotatable. The wafer sheet supporting ring 5 has an annular part 5a, which is smaller than the wafer ring 1 in diameter, and is rotated by a driving means (not shown) so as to correct the angular orientation of the pellets 3.

Bearings 10A and 10B are fastened to the supporting plate 4 so as to be positionally symmetrical with respect to the center of the wafer sheet supporting ring 5; and externally threaded screw shafts 11A and 11B, which are axially parallel to the wafer sheet supporting ring 5, are rotatably supported by these bearings 10A and 10B. Internally threaded screws 12A and 12B are screw-engaged with the externally threaded screw shafts A and 11B, and ring holder raising/lowering members 13A and 13B are fastened to the internally threaded screws 12A and 12B. Rollers 15 and 16 are rotatably provided on these ring holder raising/lowering members 13A and 13B so that the rollers 15 and 16 hold peripheral portions of a wafer sheet stretching ring holder 14 from above and below.

Figure 3:
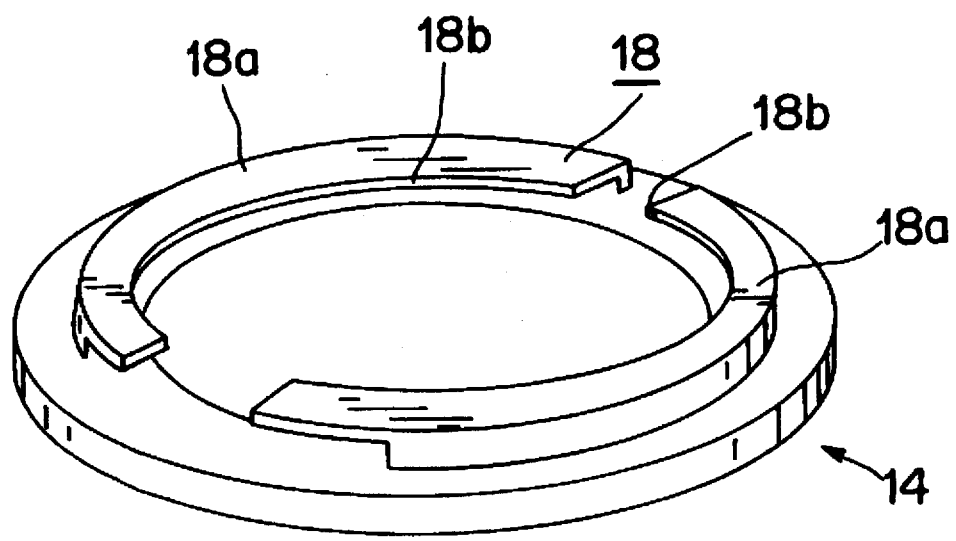
FIG. 3 shows a wafer sheet stretching ring holder used in the pellet pick-up device.

A wafer ring holding plate 17, which temporarily holds the wafer ring 1, and a wafer sheet stretching ring 18, which is installed at a predetermined distance above the wafer ring holding plate 17, are provided on the wafer sheet stretching ring holder 14. As shown in FIG. 3, the wafer sheet stretching ring holder 14 has a central aperture, and the wafer sheet stretching ring 18 is comprised of two substantially semi-circular fastening elements 18a with an aperture in between. The inner diameter of the aperture which is formed by the inner edges 18b of the semicircular fastening elements 18a is larger than the outer diameter of the wafer sheet supporting ring 5 and smaller than the wafer sheet 1 that is placed on the wafer sheet supporting ring 5.

In the above structure, the size of the wafer sheet stretching ring 18 is set so that the inner circumferential edge 18b thereof fits over the annular part 5a of the wafer sheet supporting ring 5.

Gears 20A and 20B are coupled to portions of the externally threaded screw shafts 11A and 11B that project downward from the supporting plate 4.

First and second motors 22A and 22B are mounted on the supporting plate 4 via motor mounts 21A and 21B; and driving gears 23A and 23B are coupled to one end of the output shaft of each one of the first and second motors 22A and 22B and engage with the transmission gears 20A and 20B.

First and second single-rotation detection plates 24A and 24B which respectively have slits 24a and 24b are attached to another end of the output shaft of each one of the first and second motors 22A and 22B. In addition, first and second sensors 25A and 25B are fastened to a fixed portion of the pellet pick-up device so as to detect the slits 24a and 24b of the first and second single-rotation detection plates 24A and 24B.

In FIGS. 1 and 2, the reference numeral 30 denotes a push-up needle which pushes the pellets 3 upward from below. The push-up needle 30 is raised and lowered by a vertical driving means (not shown). In addition, the reference numeral 31 denotes a collet which is positioned above the pellets 3. The collet 31 is caused to move in vertical and horizontal directions by a vertical driving means and an XY driving means (not shown), so that the collet 31 holds the pellet 3 by vacuum suction and transfer the pellet 3 to a bonding position or a pellet placing position of a die bonder.

Figure 4:
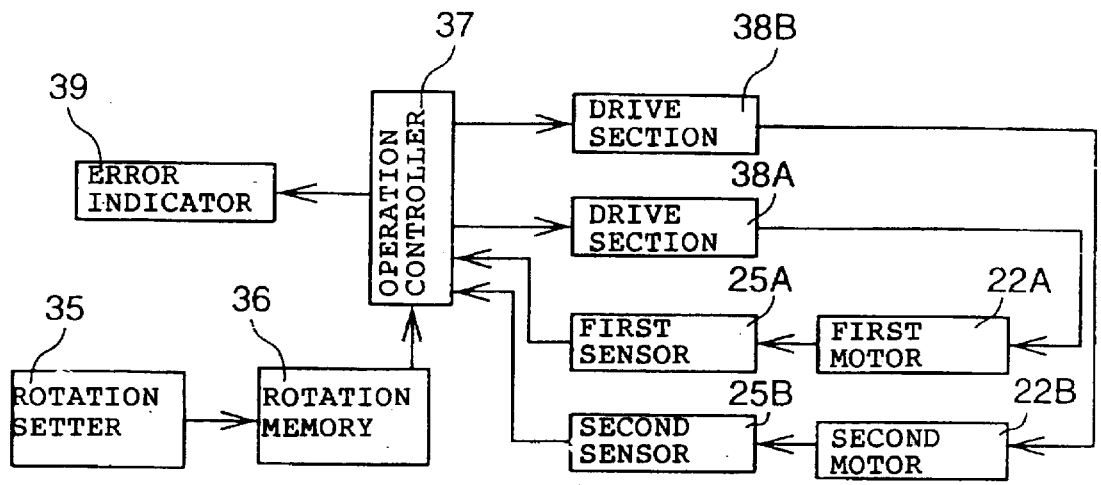
FIG. 4 is a block diagram of the control circuit for the first and second motors used in the stretching mechanism.

FIG. 4 shows the control circuit of the first and second motors 22A and 22B.

The number of rotations of both of the first and second motors 22A and 22B is stored in a rotation memory 36 via a rotation setter 35. The first and second motors 22A and 22B are driven in accordance with the number of rotations stored in the rotation memory 36 in a synchronized fashion by an operation controller 37 via drive sections 38A and 38B. In cases where the first and second motors 22A and 22B are out of synchronization, an error signal is outputted by the operation controller 37, the error is indicated on an error indicator 39 via a buzzer, warning lamp, etc., and the stretching operation is stopped.

Figure 5:
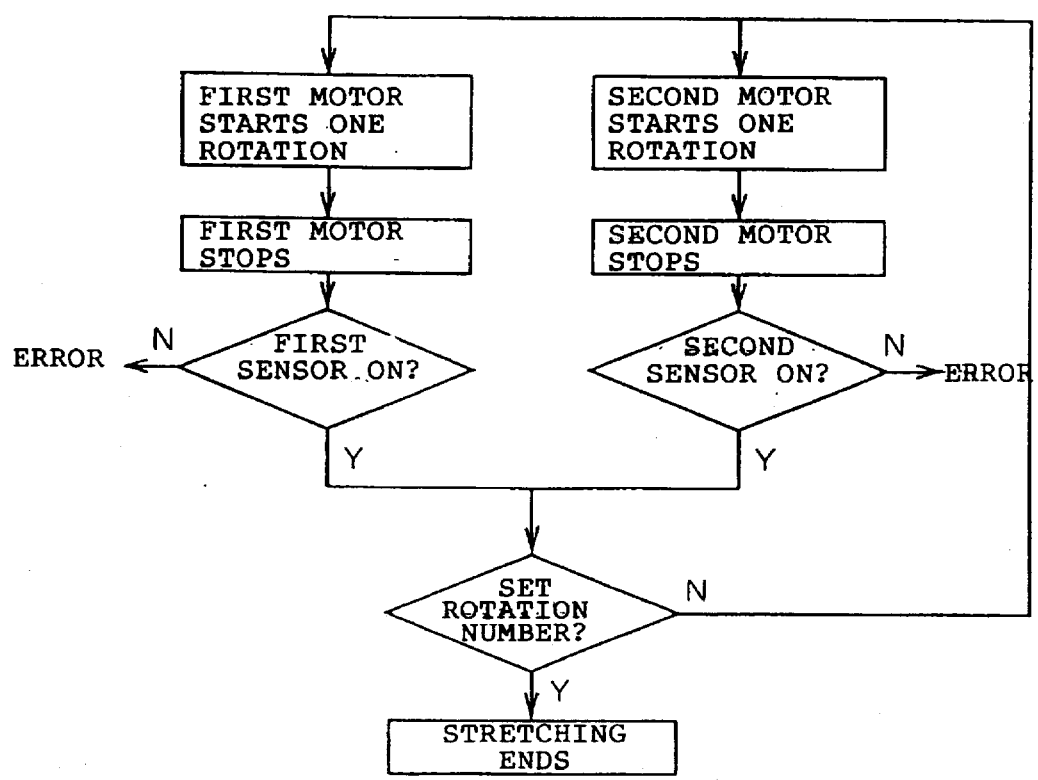
FIG. 5 is a flow chart of the control of the first and second motors.

The operation of the above preferred embodiment will be described with reference to FIGS. 4 and 5.

First, the number of rotations, for example 8, is set beforehand in the rotation memory 36 via the rotation setter 35. In the state shown in FIG. 1, a wafer ring 1 is fed by a feeding means (not shown) into the space between the wafer ring holding plate 17 and the wafer sheet stretching ring 18 from a direction perpendicular to the plane of the drawing sheet, and the wafer ring 1 is positioned on the surface of the wafer ring holding plate 17. Then, a signal which causes the first and second motors 22A and 22B to complete one rotation is outputted from the operation controller 37 via the drive sections 38A and 38B. As a result, the first and second motors 22A and 22B complete one rotation in synchronism.

When the first and second motors 22A and 22B complete one rotation, the slits 24a and 24b of the first and second single-rotation detection plates 24A and 24B switch on the first and second sensors 25A and 25B. When the first and second sensors 25A and 25B are both switched on, this means that the first and second motors 22A and 22B are rotating in synchronism. In cases where the number of ON signals from the first and second sensors 25A and 25B does not equal a set number (8 in the embodiment) of rotations, the first and second motors 22A and 22B are again rotated. This operation is repeated until the counted number of signals from the first and second sensors 25A and 25B reaches the set number of rotations, i. e., 8, then the rotation of the motors are stopped and the stretching operation is thus completed.

In cases where one of the two sensors 25A and 25B, i. e., either the first sensor 25A or the second sensor 25B, is not switched on, this means that the first and second motors 22A and 22B did not rotate in synchronism. Accordingly, an error, signal is outputted to the error indicator 39 by the operation controller 37. The error indicator 39 indicates the occurrence of the out-of-synchronization error by means of a buzzer, warning lamp, etc., and the operation controller 37 simultaneously outputs a signal which stops the operation of the pick-up device.

When the first and second motors 22A and 22B rotate in one direction, the externally threaded screw shafts 11A and 11B are rotated via the driving gears 23A and 23B and transmission gears 20A and 20B. Accordingly, the internally threaded screws 12A and 12B, ring holder raising/lowering members 13A and 13B, rollers 15 and 16 and wafer sheet stretching ring holder 14 are lowered by a fixed amount with each rotation of the first and second motors 22A and 22B.

In this preferred embodiment, an arrangement is made so that the wafer sheet stretching ring holder is lowered 1 mm by each rotation of the first and second motors 22A and 22B. In addition, a further arrangement is made so that when the first and second motors 22A and 22B complete four rotations, i. e., when the wafer sheet stretching ring holder 14 is lowered 4 mm, then the wafer sheet 2 is positioned on the outer surface of the annular part 5a of the wafer sheet supporting ring 5.

Accordingly, when the wafer sheet stretching ring holder 14 is lowered, the wafer ring holding plate 17 provided on the holder 14 is first moved below the level of the upper surface 5b of the annular part 5a of the wafer sheet supporting ring 5, and the wafer ring 1 on the wafer ring holding plate 17 is placed on the upper surface 5b of the annular part 5a of the wafer sheet supporting ring 5.

Afterward, the wafer sheet stretching ring 18 is lowered so as to fit loosely over the annular part 5a of the wafer sheet supporting ring 5 while pushing the circumferential edge of the wafer ring 1 downward. As a result, the wafer sheet 2 is stretched as shown in FIG. 2, and the spaces between the pellets 3 are widened.

After the wafer sheet 2 is thus stretched, as in a conventional pick-up device, the collet 31 is lowered and stopped at a point slightly above the pellet 3 that is to be picked up, and the push-up needle 30 is raised so as to push the pellet 3 upward. The pellet 3 thus pushed up is suction-held and raised by the collet 31, so that the pellet 3 is moved to a bonding position or a pellet placing position of the bonder.

In the above, since the wafer sheet stretching ring holder 14, in other words, the wafer sheet stretching ring 18, is raised and lowered by the synchronously driven first and second motors 22A and 22B, the amount by which the wafer sheet stretching ring 18 is lowered, that is, the amount by which the wafer sheet 2 is stretched, can be freely controlled by changing the number of rotations of the first and second motors 22A and 22B.

Furthermore, the synchronous rotation (or lack of synchronous rotation) of the first and second motors 22A and 22B is detected at each rotation by the detection means that consists of the first and second single-rotation detection plates 24A and 24B and first and second sensors 25A and 25B. Accordingly, the amount of stretching of the wafer sheet 2 can be consistent in the stretching process.

In the embodiment above, the wafer sheet supporting ring 5 is rotatably supported on the supporting plate 4 via bearings 6. However, it is possible to secure the wafer sheet supporting ring 5 on the supporting plate 4 not in a rotatable fashion or to form the wafer sheet supporting ring 5 as an integral unit with the supporting plate 4, as in a conventional device.

Furthermore, in the embodiment described above, the wafer ring holding plate 17 and wafer sheet stretching ring 18 are formed on the wafer sheet stretching ring holder 14. However, it would be possible to form the wafer ring holding plate 17 and wafer sheet stretching ring 18 integrally to the wafer sheet stretching ring holder 14.

In addition, the embodiment described uses the wafer ring 1 which is temporarily held by the wafer ring holding plate 17. However, it can be designed so that the wafer ring 1 is placed on the wafer sheet supporting ring 5 without the wafer ring holding plate 17 in between.

The synchronous rotation, in the above embodiment, is detected at each rotation of the first and second motors 22A and 22B. However, this detection is not particularly limited to intervals of one rotation. It is possible to install two sensors 25A and two sensors 25B for each of the detection plates 24A and 24B, or to form two slits 24a and two slit parts 24b on the respective detection plates 24A and 24B. In such cases, synchronous rotation can be detected at each half-rotation of the first and second motors 22A and 22B. Furthermore, it is also possible to design the system so that detection is performed at intervals of several rotations.

As seen from the above, in the present invention, the vertical driving means which lowers the wafer sheet stretching ring is comprised of synchronously driven first and second motors which are provided in a symmetrical fashion with respect to the center of the wafer sheet supporting ring. Accordingly, the amount of stretching of the wafer sheet can be arbitrarily controlled. In addition, the synchronous rotation (or lack of synchronous rotation) of the first and second motors is detected by way of the detection plates and sensors; and in cases where the two motors do not rotate in synchronism, an out-of-synchronization error signal is outputted. Accordingly, fluctuations in the amount of stretching of the wafer sheet can be detected.

We claim:

1. A pellet pick-up device equipped with a wafer sheet stretching mechanism which includes a wafer sheet supporting means on which a wafer sheet to which pellets are pasted is placed, a wafer sheet stretching means which is installed above said wafer sheet supporting means, and a vertical driving means which moves said wafer sheet stretching means upward and downward so as to stretch said wafer sheet when said wafer sheet stretching means is moved downward by said vertical driving means, wherein said vertical driving means comprises synchronously driven first and second motors which raise and lower portions of said wafer sheet stretching ring that are symmetrical with respect to a center of said wafer sheet supporting means.

2. A pellet pick-up device according to claim 1, wherein a synchronous rotation or lack of synchronous rotation of said first and second motors is detected so that an out-of-synchronization error signal is outputted when said first and second motors are not rotating in synchronism.

3. A pellet pick-up device equipped with a wafer sheet stretching mechanism which comprises:

a wafer sheet supporting means provided on a base plate, said wafer sheet supporting means being in a cylindrical shape so that a wafer sheet to which pellets are pasted is placed thereon;

a supporting ring provided so as to move on an outer surface of said wafer sheet supporting means;

a wafer sheet stretching means provided on said supporting ring, said stretching means having an annular aperture which is larger in diameter than said wafer sheet supporting means and smaller in diameter than said wafer sheet placed on said wafer sheet supporting means; and a pair of driving means provided on said base plate so as to be at diametrically opposite locations with reference to said wafer sheet supporting means, each one of said pair of vertical driving means comprising:

a drive shaft provided outside of said wafer sheet supporting means and axially parallel to said wafer sheet supporting means;

a moving element movable on said drive shaft and connected to said supporting ring;

a driving source for rotating said drive shaft and moving said moving element on said drive shaft, so that when said moving element is moved in one direction said aperture of said wafer sheet stretching means is spacedly engaged with said wafer sheet supporting means with an outer edge of said wafer sheet in between, said driving source of one of said pair of vertical driving means being actuated in synchronism with a driving source of an other one of said pair of vertical driving means.

4. A pellet pick-up device according to claim 4, further comprising a rotation indication means rotatably provided on said driving source of each one of said pair of vertical driving means, and a sensor means provided adjacent to said driving source so as to detect a rotation of said rotation indication means.

* * * * *